United States Patent
Uchida et al.

(10) Patent No.: US 10,778,001 B2
(45) Date of Patent: Sep. 15, 2020

(54) OVERCURRENT DETECTION CIRCUIT AND POWER CONVERTER

(71) Applicant: Mitsubishi Electric Corporation, Chiyoda-ku, Tokyo (JP)

(72) Inventors: Kenta Uchida, Tokyo (JP); Ryosuke Nakagawa, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days.

(21) Appl. No.: 16/604,751

(22) PCT Filed: Apr. 18, 2017

(86) PCT No.: PCT/JP2017/015618
§ 371 (c)(1),
(2) Date: Oct. 11, 2019

(87) PCT Pub. No.: WO2018/193527
PCT Pub. Date: Oct. 25, 2018

(65) Prior Publication Data
US 2020/0067303 A1 Feb. 27, 2020

(51) Int. Cl.
| | |
|---|---|
| *H02H 7/12* | (2006.01) |
| *G01R 19/12* | (2006.01) |
| *G01R 19/165* | (2006.01) |
| *H02H 1/00* | (2006.01) |
| *H02M 7/537* | (2006.01) |

(52) U.S. Cl.
CPC .......... *H02H 7/1203* (2013.01); *G01R 19/12* (2013.01); *G01R 19/16571* (2013.01); *H02H 1/0007* (2013.01); *H02M 7/537* (2013.01)

(58) Field of Classification Search
None
See application file for complete search history.

(56) References Cited

U.S. PATENT DOCUMENTS 6,304,472 B1 * 10/2001 Nagasu ............... H02M 7/003
363/97
2007/0139831 A1 * 6/2007 Wright ............... H01H 59/0009
361/2

(Continued)

FOREIGN PATENT DOCUMENTS

| JP | H10225135 A | 8/1998 |
| JP | 3454186 B2 | 10/2003 |
| JP | 2017005836 A | 1/2017 |

OTHER PUBLICATIONS

International Serach Report (PCT/ISA/210) dated Jun. 20, 2017, by the Japan Patent Office as the International Searching Authority for International Application No. PCT/JP2017/015618.

(Continued)

*Primary Examiner* — Jeffrey A Gblende
(74) *Attorney, Agent, or Firm* — Buchanan Ingersoll & Rooney PC

(57) ABSTRACT

An overcurrent detection circuit includes a di/dt detection circuit to detect di/dt of a current Ie that flows in an emitter of an IGBT, a control circuit to detect whether the current Ie is an overcurrent based on di/dt and to output a detection result to a driving circuit, and a mask circuit to set a mask period in which an operation of overcurrent determination in the control circuit is masked.

18 Claims, 8 Drawing Sheets

(56) References Cited

U.S. PATENT DOCUMENTS

2013/0083576 A1* 4/2013 Gan .................. H03K 17/168
                                                  363/123
2015/0009729 A1* 1/2015 Wu .................... H02H 7/1203
                                                  363/50

OTHER PUBLICATIONS

Written Opinion (PCT/ISA/237) dated Jun. 20, 2017, by the Japan Patent Office as the International Searching Authority for International Application No. PCT/JP2017/015618.
Indian Office Action dated Jun. 19, 2020 issued by the Indian Patent Office in corresponding Indian Patent Application No. 201927044205, with English translation (6 pages).

* cited by examiner

OVERCURRENT DETECTION CIRCUIT AND POWER CONVERTER

FIELD

The present invention relates to an overcurrent detection circuit for protecting a switching element that constitutes a power conversion main circuit from an overcurrent, and a power converter including the overcurrent detection circuit.

BACKGROUND

In a power converter, detection of an overcurrent that flows through an individual switching element constituting a power conversion main circuit is performed in order to protect the switching element from the overcurrent.

In Patent Literature 1 listed below, a voltage generated in an inductance component to be connected to a main terminal of a switching element is integrated with an integrator, and an output of the integrator is subjected to threshold determination. In this manner, it is determined whether a current that flows in an individual switching element is an overcurrent.

CITATION LIST

Patent Literature

Patent Literature 1: Japanese Patent No. 3454186

SUMMARY

Technical Problem

However, the method using an integrator as described in Patent Literature 1 has a problem that it takes a long time to determine whether the current to be determined is an overcurrent, and this results in a long detection time.

The present invention has been achieved in view of the above problem, and an object of the present invention is to provide an overcurrent detection circuit that can reduce a time required for determination whether a current that flows in a switching element is an overcurrent.

Solution to Problem

To solve the above problems and achieve the object an overcurrent detection circuit according to the present invention is provided to correspond to each of a plurality of switching elements that constitute a power conversion main circuit, and detects an overcurrent in a corresponding one of the switching elements. The overcurrent detection circuit comprises: a detection circuit to detect a rate of time change of a current that flows in a main terminal of the switching element; and a control circuit to detect whether the current that flows in the main terminal of the switching element is an overcurrent based on the rate of time change and to output a detection result to a driving circuit provided to correspond to the switching element.

Advantageous Effects of Invention

According to the present invention, there is an effect where a time required for determination whether a current to be determined is an overcurrent can be reduced.

DESCRIPTION OF EMBODIMENTS

An overcurrent detection circuit and a power converter according to embodiments of the present invention will be described in detail below with reference to the accompanying drawings. The present invention is not limited to the embodiments.

First Embodiment

Figure 1:
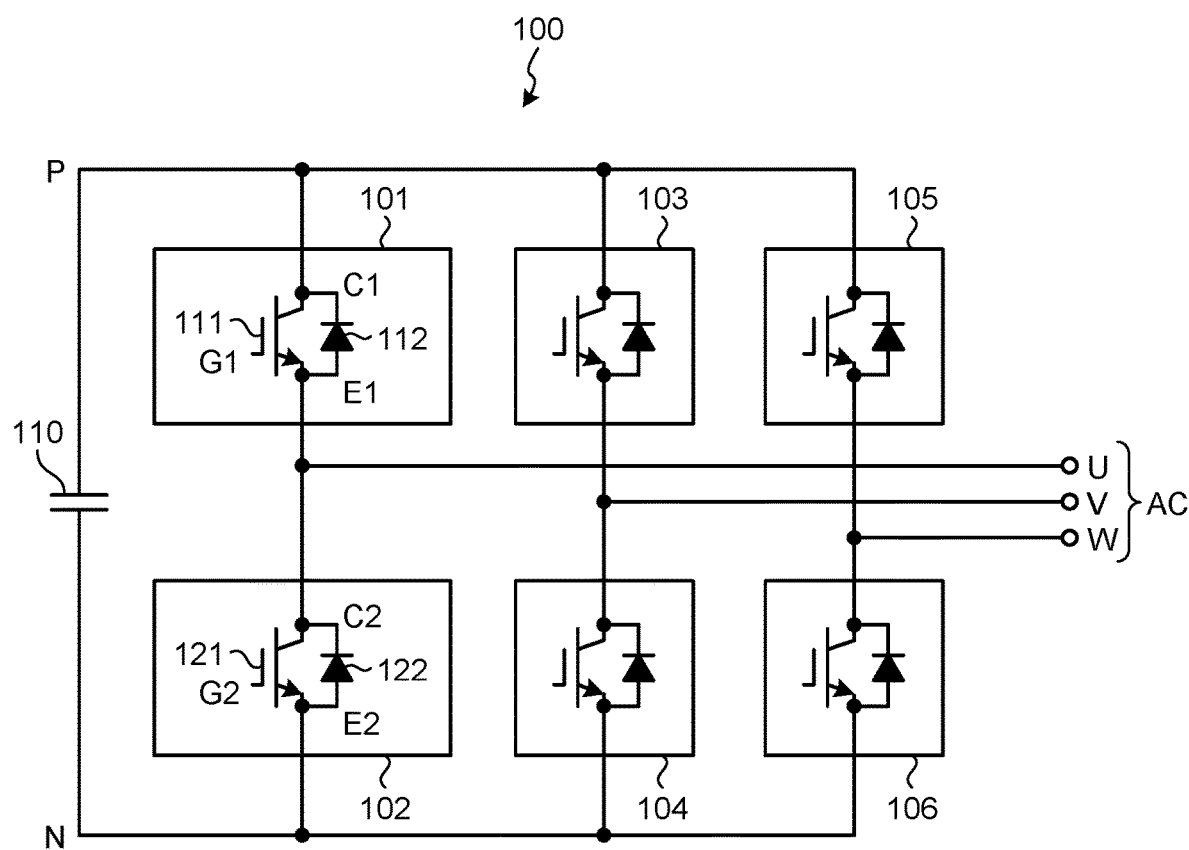
FIG. 1 is a circuit diagram illustrating a configuration of a power conversion main circuit in a power converter according to a first embodiment.

FIG. 1 is a circuit diagram illustrating a configuration of a power conversion main circuit 100 in a power converter according to a first embodiment. As illustrated in FIG. 1, the power conversion main circuit 100 includes semiconductor element modules 101, 103, and 105 forming positive arms and semiconductor element modules 102, 104, and 106 forming negative arms.

The semiconductor element modules 101 to 106 are connected between direct current terminals of a smoothing capacitor 110 having a potential of a positive terminal P and a potential of a negative terminal N. The semiconductor element modules 101 and 102 are connected to each other in series between the positive terminal P and the negative terminal N. A connection point between the semiconductor element modules 101 and 102 is drawn out to form a U-phase alternating current (AC) terminal. In the following descriptions, similarly, the semiconductor element modules 103 and 104 are connected to each other in series between the positive terminal P and the negative terminal N. A connection point between the semiconductor element modules 103 and 104 is drawn out to form a V-phase alternating current terminal. Further, the semiconductor element modules 105 and 106 are connected to each other in series between the positive terminal P and the negative terminal N. A connection point between the semiconductor element modules 105 and 106 is drawn out to form a W-phase alternating current terminal. These semiconductor element modules 101 to 106 perform a switching operation that converts direct current power accumulated in the smoothing capacitor 110 to alternating current power.

The semiconductor element module 101 includes an IGBT 111 that is a switching element and a flywheel diode (hereinafter, "FWD") 112 connected to the IGBT 111 in anti-parallel connection. A collector of the IGBT 111 and a cathode of the FWD 112 are connected to each other to form a main terminal C1, and an emitter of the IGBT 111 and an anode of the FWD 112 are connected to each other to form a main terminal E1. The semiconductor element module 102 includes an IGBT 121 and an FWD 122 connected to the IGBT 121 in anti-parallel connection. A collector of the IGBT 121 and a cathode of the FWD 122 are connected to each other to form a main terminal C2, and an emitter of the IGBT 121 and an anode of the FWD 122 are connected to each other to form a main terminal E2. Further, terminals G1 and G2 that are control terminals are formed at gates of the IGBTs 111 and 121, respectively. The remaining semiconductor element modules 103 to 106 are also configured in an identical manner to the semiconductor element modules 101 and 102. Although IGBTs are exemplified in FIG. 1 as switching elements, MOSFETs may be used in place of IGBTs.

Figure 2:
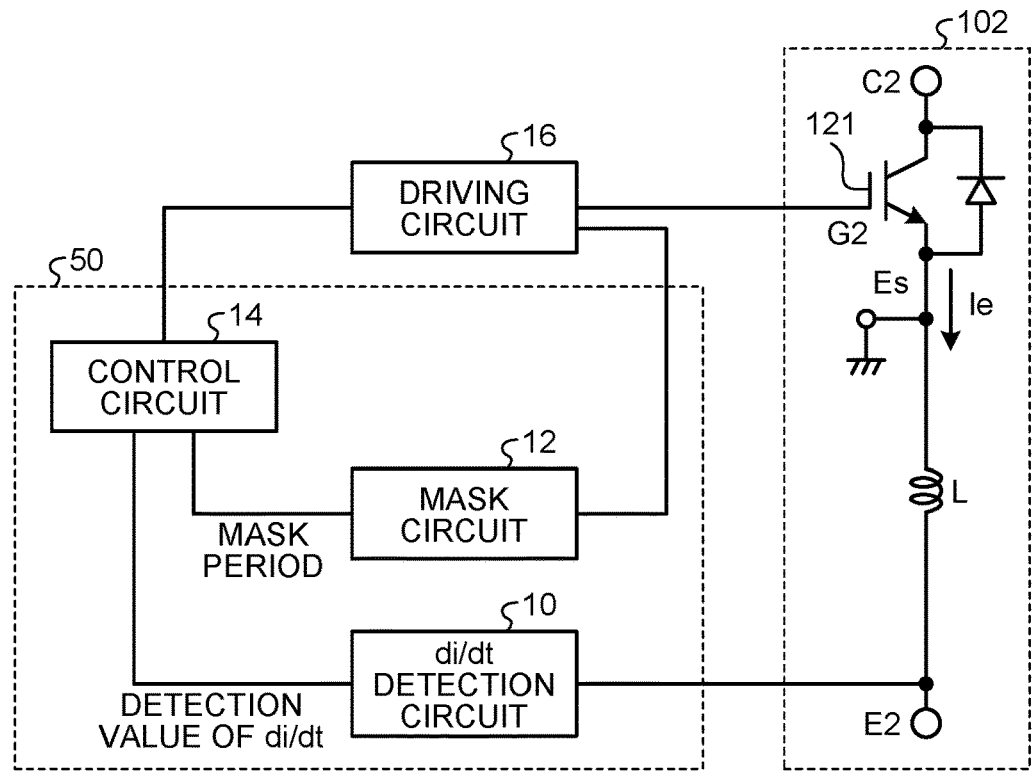
FIG. 2 is a block diagram illustrating a configuration of an overcurrent detection circuit according to the first embodiment.

FIG. 2 is a block diagram illustrating a configuration of an overcurrent detection circuit 50 according to the first embodiment. The semiconductor element module 102 forming a negative arm in FIG. 1 is illustrated in the right portion of FIG. 2. The overcurrent detection circuit 50 according to the first embodiment is provided together with a driving circuit 16. That is, the overcurrent detection circuit 50 is provided together with the driving circuit 16 to correspond to each of a plurality of switching elements that constitute the power conversion main circuit 100.

The driving circuit 16 applies a control signal to the terminal G2 of the semiconductor element module 102 to control electrical continuity of the IGBT 121.

The overcurrent detection circuit 50 includes a di/dt detection circuit 10, a mask circuit 12, and a control circuit 14. The di/dt detection circuit 10 detects di/dt that is a rate of time change of a current Ie that flows in an emitter of the IGBT 121. FIG. 2 illustrates a parasitic inductance component L of electric wiring. As is well known, when the current Ie flows, a voltage of L·(di/dt) is induced at both ends of the parasitic inductance component L. Therefore, di/dt can be detected by detecting the induced voltage L·(di/dt) generated at the both ends of the parasitic inductance component L.

As also illustrated in FIG. 2, a general semiconductor element module is provided with a sense emitter terminal Es for detecting a current. Therefore, it is possible to detect di/dt by grounding the sense emitter terminal Es and detecting a potential of the terminal E2 that is an emitter terminal of the semiconductor element module 102 or any position at which the parasitic inductance component L required for detection is obtained. Further, because the di/dt detection circuit 10 is formed outside a chip in which the IGBT 121 is formed, reduction of a chip area can be avoided. With this configuration, it is possible to prevent reduction of the current rating of the IGBT 121.

Further, a sense collector terminal is provided in a general semiconductor element module in some cases, and there is some kind of parasitic inductance component also in collector-side electric wiring. Therefore, it is also possible to configure that di/dt is detected: by detecting a potential difference between the sense collector element and any position at which the parasitic inductance component required for detection is obtained; or by detecting a potential difference between the sense collector terminal and the main terminal C2.

The control circuit 14 detects whether the current Ie is an overcurrent based on a detection value of di/dt detected by the di/dt detection circuit 10 and outputs a result of the detection to the driving circuit 16. The mask circuit 12 retains a preset mask time. The mask circuit 12: receives a gate-on signal from the driving circuit 16; sets a mask period that is in synchronization with the gate-on signal and is obtained by adding the mask time to a time of the gate-on signal; and transmits the mask period to the control circuit 14. The gate-on signal is a signal that makes an IGBT, which is a switching element, electrically conducting. The mask period is a period in which an operation of overcurrent determination is masked. While the mask period is set, the control circuit 14 does not perform a process of determining whether the current Ie is an overcurrent. While the mask period is set, the control circuit 14 ignores the detection result of the di/dt detection circuit 10, and does not transmit a detection result that the current Ie is an overcurrent to the driving circuit 16 even when the current Ie is an overcurrent. Further, in place of this process, the control circuit 14 may hold the detection result of the di/dt detection circuit 10 not to transmit the detection result whether the current Ie is an overcurrent to the driving circuit 16 while the mask period is set. The determination process in the control circuit 14 is described later in detail.

In FIG. 2, a configuration of detecting an overcurrent in the semiconductor element module 102 forming a negative arm is illustrated. Also for an overcurrent in a semiconductor element module forming a positive arm, it is possible to detect the overcurrent by detecting and taking in an induced voltage generated at both ends of a parasitic inductance component present on a collector side and performing threshold determination with regard to a taken detection value.

Figure 3:
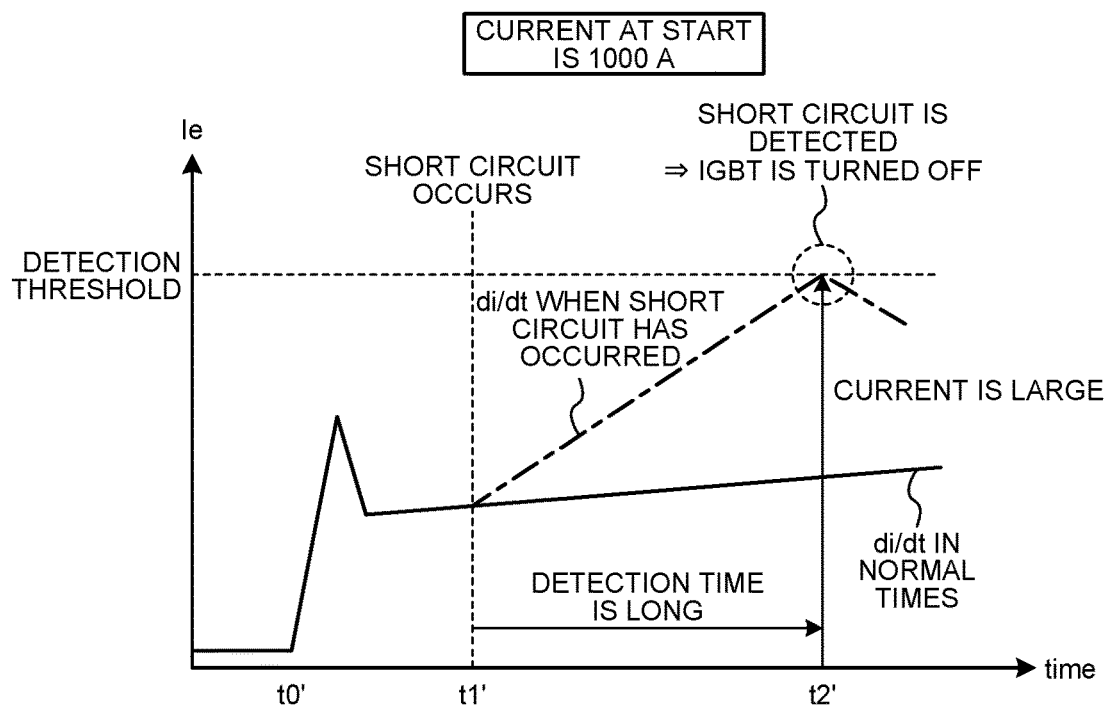
FIG. 3 is a first explanatory diagram of a concept of overcurrent protection in Patent Literature 1.
Figure 4:
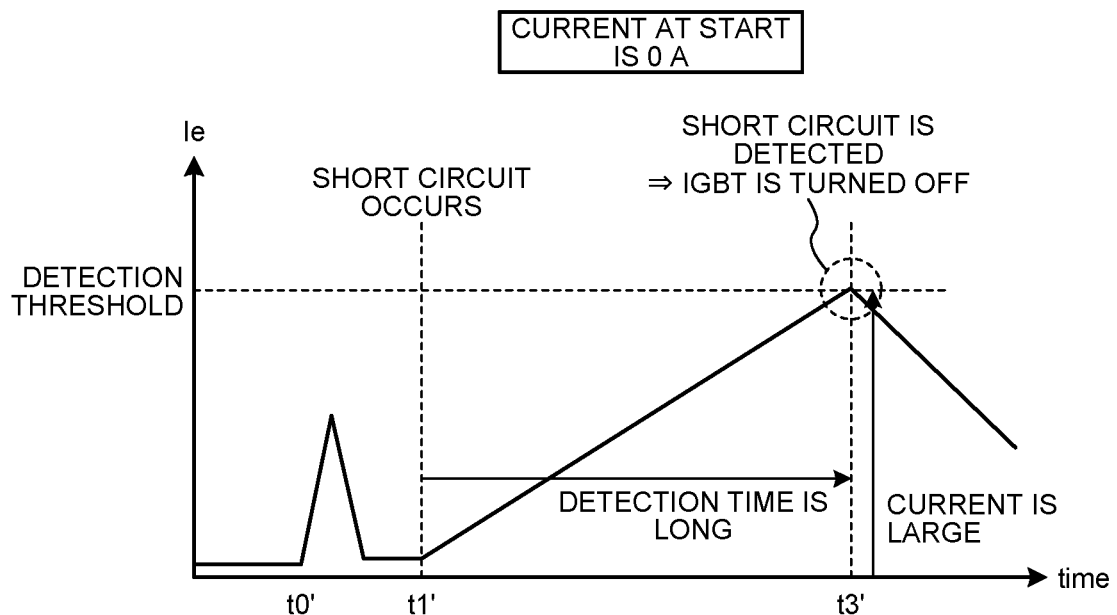
FIG. 4 is a second explanatory diagram of a concept of overcurrent protection in Patent Literature 1.
Figure 5:
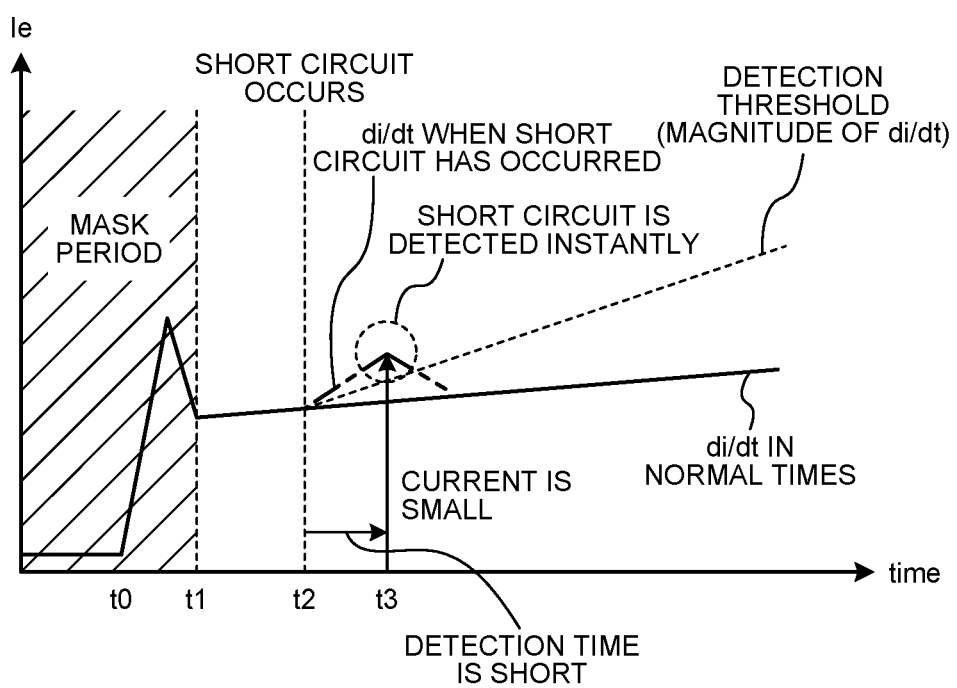
FIG. 5 is an explanatory diagram of a concept of overcurrent protection in the first embodiment.
Figure 6:
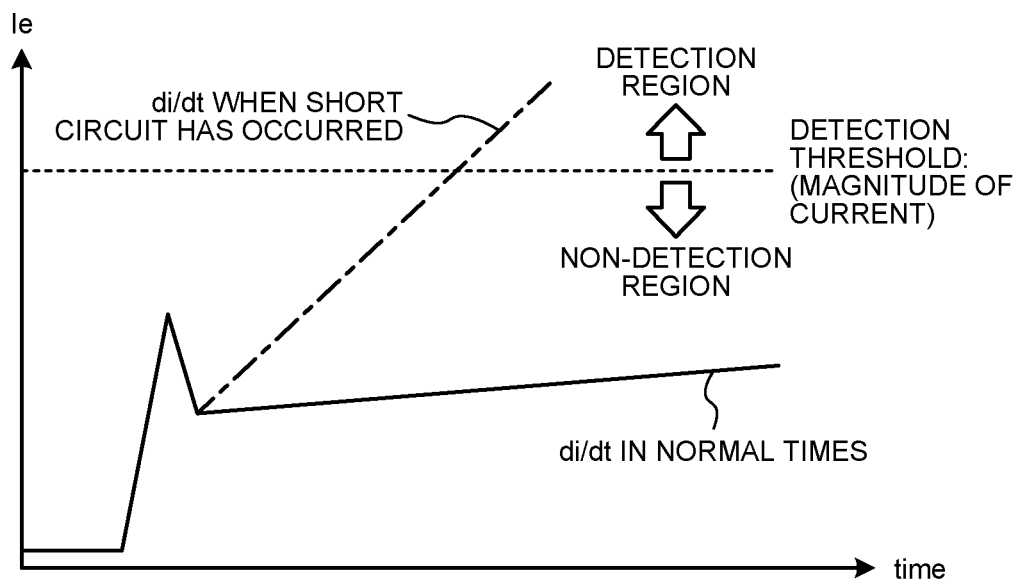
FIG. 6 is a first explanatory diagram of a detection region divided by threshold determination in Patent Literature 1.
Figure 7:
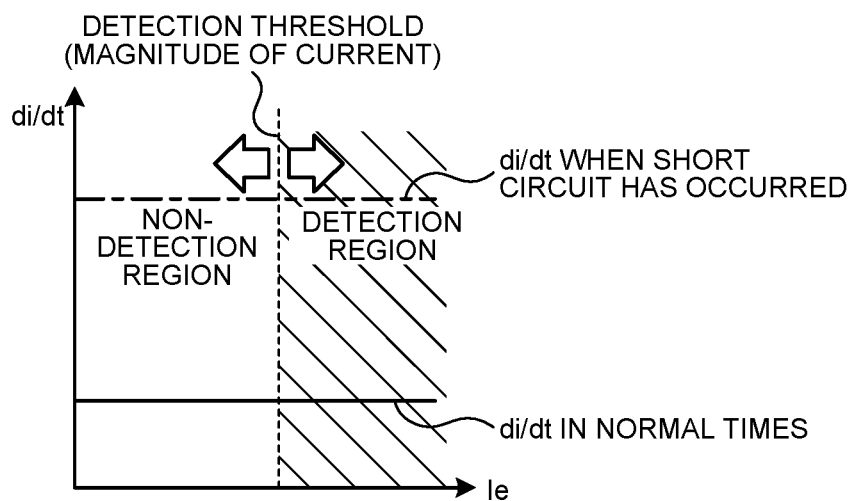
FIG. 7 is a second explanatory diagram of a detection region divided by threshold determination in Patent Literature 1.
Figure 8:
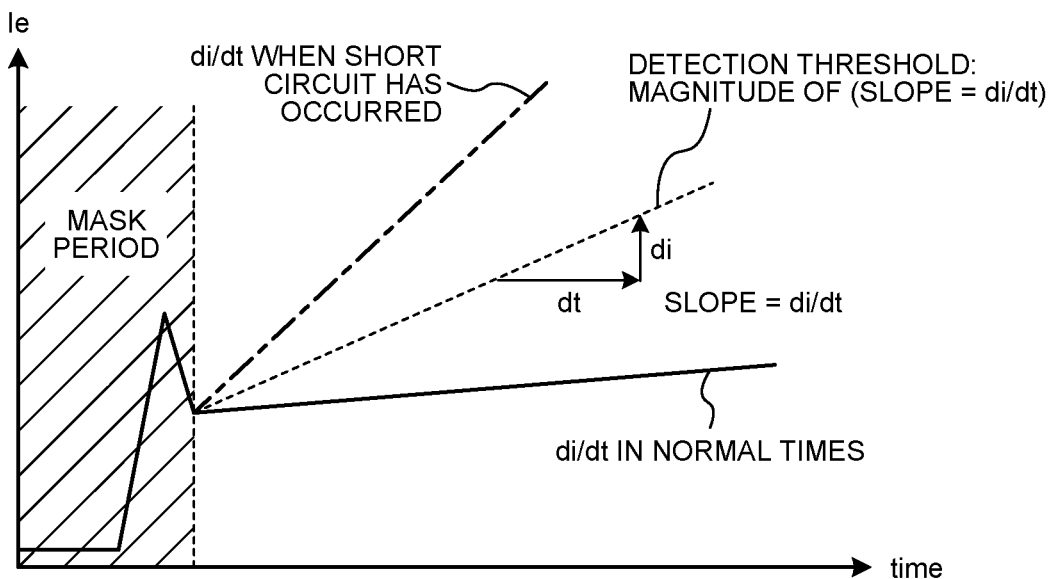
FIG. 8 is a first explanatory diagram of a concept of the overcurrent detection circuit according to the first embodiment.
Figure 9:
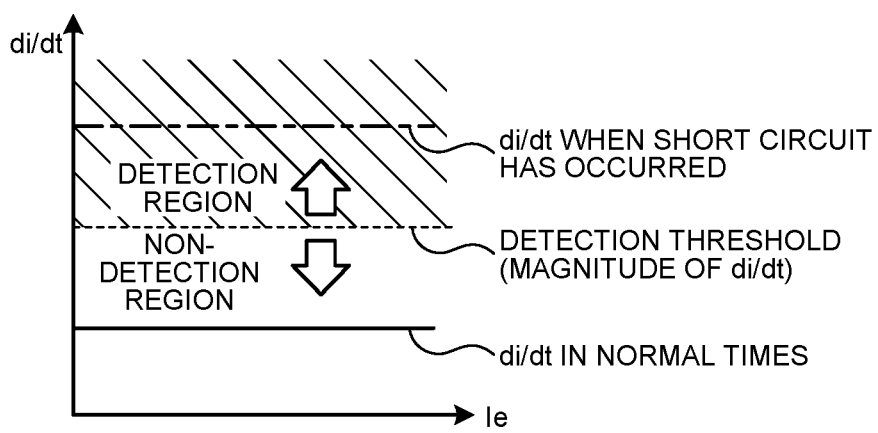
FIG. 9 is a second explanatory diagram of a concept of the overcurrent detection circuit according to the first embodiment.

Next, characteristics and effects of the overcurrent detection circuit according to the first embodiment are described with reference to FIGS. 3 to 9. FIGS. 3 and 4 are first and second explanatory diagrams of a concept of overcurrent protection in Patent Literature 1. FIGS. 3 and 4 are different from each other in the current at start. FIG. 5 is an explanatory diagram of a concept of overcurrent protection in the first embodiment. FIGS. 6 and 7 are first and second explanatory diagrams of a detection region divided by threshold determination in Patent Literature 1. FIGS. 8 and 9 are first and second explanatory diagrams of a concept of the overcurrent detection circuit according to the first embodiment.

FIG. 3 illustrates an example in which a steep current flows immediately after turning on a gate at a time t0' and thereafter a large current of about 1000 A flows. The waveform indicated by a solid line represents a current in normal times. In normal times, the current Ie rises in accordance with di/dt in normal times. Meanwhile, assuming that a short circuit occurs at a time t1', the current Ie rises in accordance with di/dt when a short circuit has occurred, as indicated by a waveform of a long-dashed short-dashed line. Thereafter, the short circuit is detected at a time t2' at which the current Ie reaches a detection threshold, and an IGBT is turned off forcibly. FIG. 4 illustrates an example in which a current at start is 0 A, and the other conditions are the same as those in the example in FIG. 3. In FIG. 4, a short circuit is detected at a time t3'. It is found from the waveforms in FIGS. 3 and 4 that a steep current immediately after turning on a gate hardly depends on the current at start. Therefore, it is difficult to change a detection threshold in accordance with the current at start. Further, in order to avoid a peak immediately after turning on a gate, it is necessary to set the detection threshold to a large value. Therefore, it takes a long time until detection of a short circuit in overcurrent protection according to Patent Literature 1.

While FIG. 5 illustrates a case of overcurrent protection according to the first embodiment, the current waveform is the same as that in FIG. 3, a steep current having a large peak value flows immediately after turning on a gate at a time t0, and the steep current is settled at a time t1. Assuming that a short circuit occurs at a time t2, a current when a short circuit has occurred is represented by a waveform of a long-dashed short-dashed line, and the current Ie rises in accordance with di/dt when a short circuit has occurred. As described above, in overcurrent protection according to the first embodiment, an overcurrent with regard to the current Ie is determined based on a detection value of the magnitude of di/dt, and a slope of a waveform of a broken line is set as a detection threshold. As illustrated in FIG. 5, the slope of the current waveform when a short circuit has occurred is larger than the slope of the waveform set as the detection threshold. Therefore, it is possible to detect a short circuit at a time t3. In addition, as illustrated by hatching, a short circuit cannot be detected from a slope of a steep current that appears immediately after turning on a gate, because a period until the time t1 is set as a mask period. In this manner, overcurrent protection according to the first embodiment can prevent the detection time from becoming longer.

FIGS. 6 and 7 illustrate a detection region and a non-detection region divided by overcurrent protection according to Patent Literature 1, and FIGS. 8 and 9 illustrate a detection region and a non-detection region divided by overcurrent protection according to the first embodiment.

The method of Patent Literature 1 uses the magnitude of a current as a detection threshold. Therefore, it is difficult to enlarge the detection region. On the other hand, the method of the first embodiment uses di/dt as a detection threshold, and therefore, it is possible to enlarge the detection region. Further, by setting a mask period, the method of the first embodiment can avoid detection of a steep current having a large peak value that appears immediately after turning on a gate, and therefore, it is possible to enlarge the detection region without changing the magnitude of the detection threshold.

As described above, the overcurrent detection circuit and the power converter according to the first embodiment are configured to detect a rate of time change of a current that flows in a main terminal of a switching element. Therefore, it is possible to prevent a detection time from becoming longer and to reduce a time required for determining whether the current that flows in the switching element is an overcurrent.

Further, according to the power converter of the first embodiment, a mask period in which an operation of overcurrent determination is masked is set immediately after turning on a gate of the switching element. Therefore, it is possible to avoid detection of a steep current having a large peak value that appears immediately after turning on the gate, and a detection region can be enlarged without changing the magnitude of a detection threshold.

Furthermore, the power converter according to the first embodiment can detect an induced voltage that can be generated in the switching element by using a sense emitter terminal or a sense collector terminal, and therefore the power converter can identify the switching element in which an overcurrent is being generated.

Second Embodiment

Figure 10:
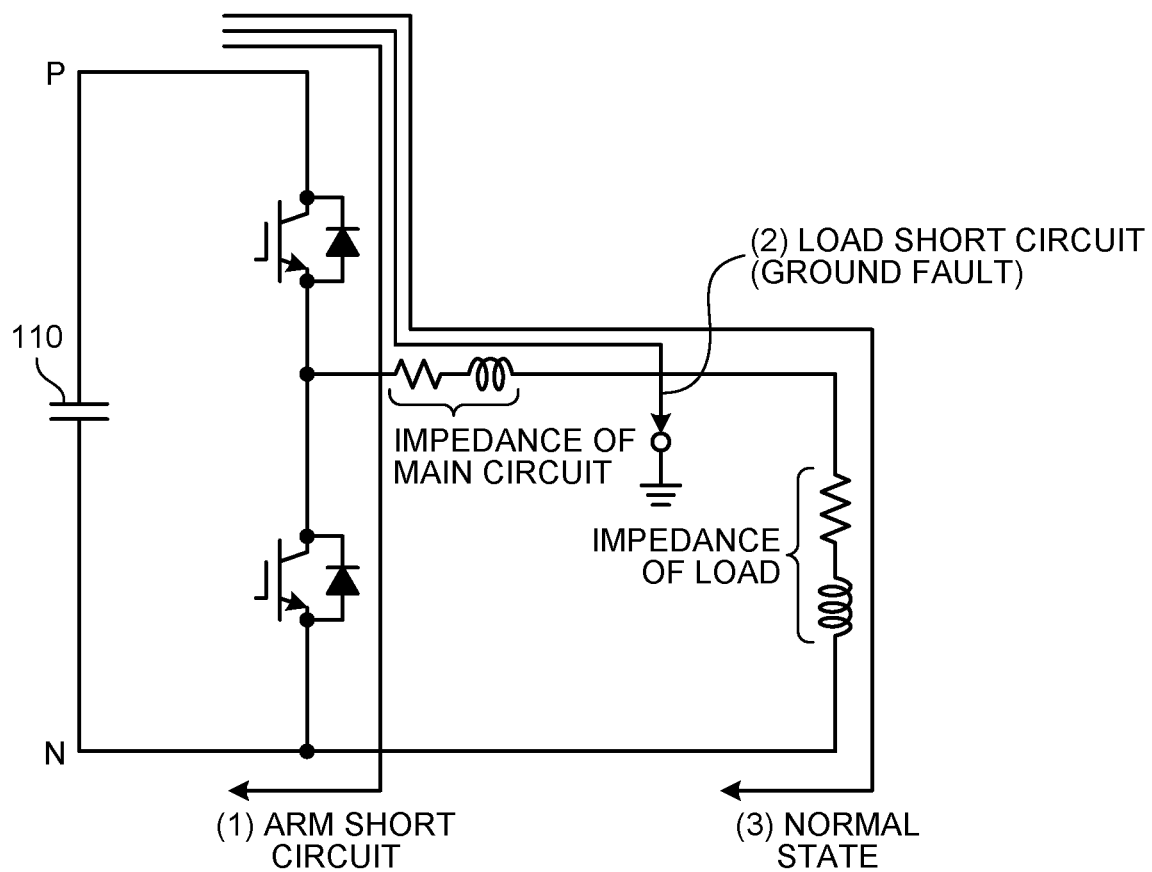
FIG. 10 is an explanatory diagram of types of short circuits that can occur in a power converter.

In a second embodiment, there is described an overcurrent detection circuit that corresponds to the overcurrent detection circuit according to the first embodiment having a function of identifying the types of short circuits added thereto. FIG. 10 is an explanatory diagram of the types of short circuits that can occur in a power converter.

FIG. 10 only illustrates an arm of one phase from the power conversion main circuit illustrated in FIG. 1. Further, in FIG. 10, an impedance of the power conversion main circuit and an impedance of a load are represented with circuit signs for a resistor and an inductor.

In FIG. 10, a current path illustrated in (1) is a current path that can be generated when switching elements of positive and negative arms are turned on at the same time, and can be generated when a short-circuit failure occurs in at least one of the switching elements of the positive-negative arms and another switching element without a short-circuit failure is turned on. The short-circuit failure illustrated in (1) is called "arm short circuit" in general. In the following descriptions, the "arm short circuit" is called "first short circuit" as appropriate.

A current path illustrated in (2) can be generated when a short-circuit failure occurs between a connection point between the switching elements of the positive and negative arms and a load or inside the load. A short-circuit failure illustrated in (2) is called "load short circuit" or "ground fault" in general. A current path illustrated in (3) is a path of a load current when no short-circuit failure occurs, that is, a current path in a normal state. The "load short circuit" is a short circuit that is caused by the principle different from that of the "arm short circuit" described above. In the following descriptions, the "load short circuit" is called "second short circuit" as appropriate.

Figure 11:
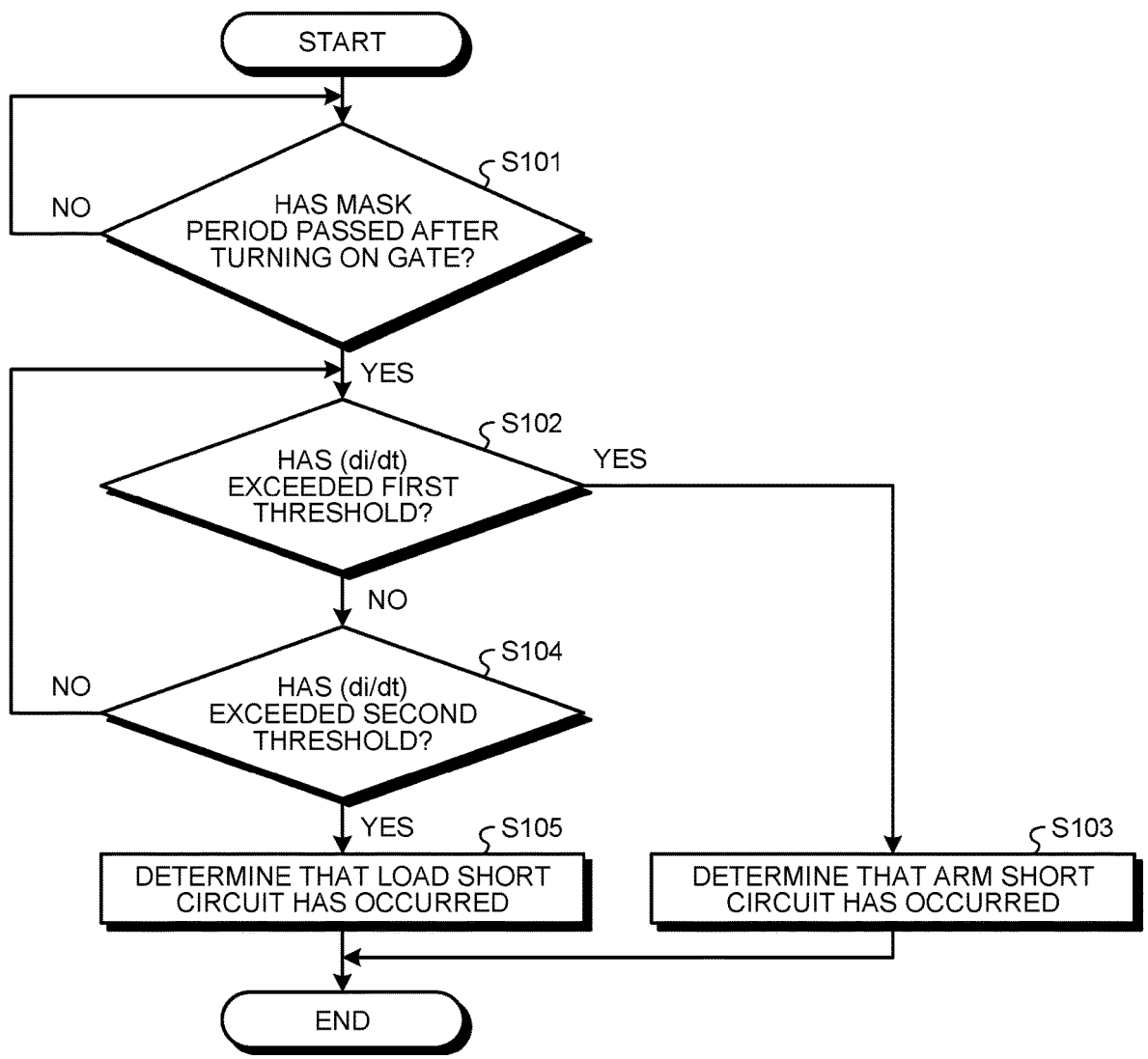
FIG. 11 is a flowchart illustrating a process flow in a second embodiment.

FIG. 11 is a flowchart illustrating a process flow in the second embodiment, that is, a process flow of identifying the types of short circuits. The process flow in FIG. 11 is described below. The process flow in FIG. 11 is based on an assumption that a process of detecting di/dt is always performed.

First, it is determined whether a mask period has passed after turning on a gate of a switching element to be protected (Step S101). When the mask period has not passed yet (NO at Step S101), the determination process at Step S101 is repeated. When the mask period has passed (YES at Step S101), the procedure shifts to Step S102. Next, it is determined whether a detection value of di/dt has exceeded a first threshold (Step S102). When the detection value of di/dt has exceeded the first threshold (YES at Step S102), the procedure shifts to Step S103 where it is then determined that an arm short circuit has occurred, and the processing is ended. It is needless to mention that the gate of the switching element to be protected is turned off at this time.

When the detection value of di/dt is equal to or smaller than the first threshold (NO at Step S102), the procedure shifts to Step S104 where it is then determined whether the detection value of di/dt has exceeded a second threshold (Step S104). The second threshold is smaller than the first threshold. When the detection value of di/dt has not exceeded the second threshold (NO at Step S104), the procedure returns to Step S102. Meanwhile, when the detection value of di/dt has exceeded the second threshold (YES at Step S104), the procedure shifts to Step S105 where it is then determined that a load short circuit has occurred, and the processing is ended. It is needless to mention that the gate of the switching element to be protected is turned off at this time.

Although the determination result when the detection value of di/dt and the first threshold are equal to each other is "NO" in the determination at Step S102 described above, the determination result may be "YES". That is, a case where the detection value of di/dt and the first threshold are equal to each other may be determined as either "YES" or "NO".

Further, although the determination result when the detection value of di/dt and the second threshold are equal to each other is "NO" in the determination at Step S104 described above, the determination result may be "YES". That is, a case where the detection value of di/dt and the second threshold are equal to each other may be determined as either "YES" or "NO".

As described above, the overcurrent detection circuit and the power converter according to the second embodiment determine that an arm short circuit that is the first short circuit has occurred in a switching element when di/dt has exceeded the first threshold, and determine that a load short circuit that is the second short circuit has occurred in the switching element when di/dt has exceeded the second threshold smaller than the first threshold. Accordingly, there is an advantageous effect that it is possible to notify a user of the type of the short circuit. Further, there is also an advantageous effect that because the user can be notified of the type of the short circuit, the user can easily determine failure analysis.

Third Embodiment

Figure 12:
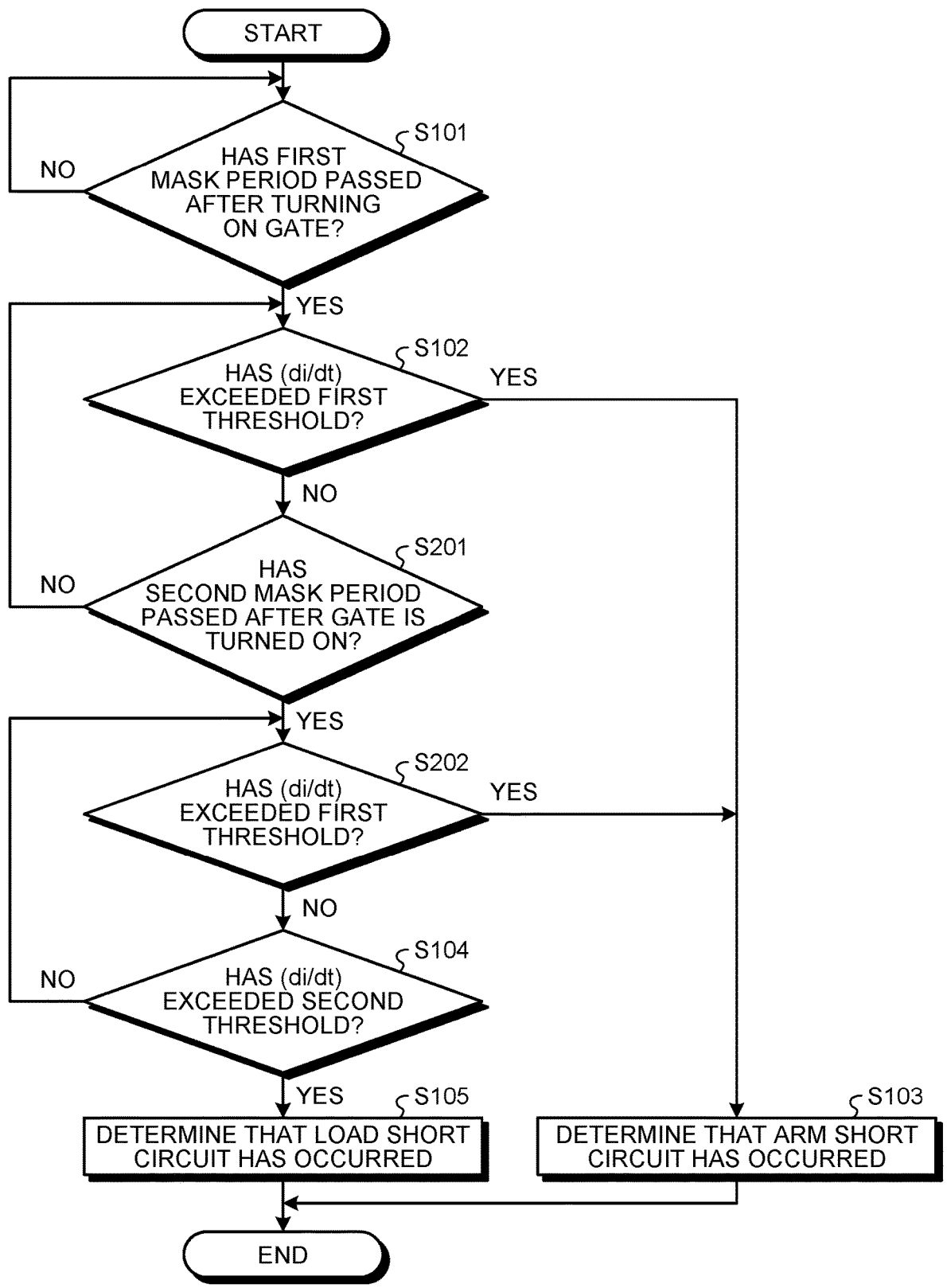
FIG. 12 is a flowchart illustrating a process flow in a third embodiment.

In a third embodiment, a process using a mask period that is specialized to the type of a short circuit is described in the processing of the overcurrent detection circuit according to the second embodiment. FIG. 12 is a flowchart illustrating a process flow in the third embodiment. The process flow in FIG. 12 is based on an assumption that a process of detecting di/dt is always performed. Further, in the process flow in FIG. 12, in order to specify two types of mask periods, the mask period used in the process flow in FIG. 11 is called "first mask period", and a mask period added in the process flow in FIG. 12 is called "second mask period".

Next, the process flow in FIG. 12 is described. The following descriptions are made mainly to a process added to the processes in the second embodiment in order to avoid redundant descriptions.

First, the flow until the process at Step S102 is the same as that in the second embodiment. In addition, the flow that, when the detection value of di/dt has exceeded the first threshold in the process at Step S102 (YES at Step S102), the procedure shifts to Step S103 where it is then determined that an arm short circuit has occurred is also the same as that in the second embodiment.

Meanwhile, when the detection value of di/dt has been determined as being equal to or smaller than the first threshold (NO at Step S102), it is then determined whether the second mask period has passed after a gate of a switching element to be protected is turned on (Step S201). When the second mask period has not passed yet (NO at Step S201), the procedure returns to the determination at Step S102, and when the second mask period has passed (YES at Step S201), the procedure shifts to Step S202.

Subsequently, it is determined whether the detection value of di/dt has exceeded the first threshold (Step S202). When the detection value of di/dt has exceeded the first threshold (YES at Step S202), the procedure shifts to Step S103 where it is then determined that an arm short circuit has occurred, and the processing is ended. Meanwhile, when the detection value of di/dt has not exceeded the first threshold (NO at Step S202), the procedure shifts to Step S104 where it is then determined whether the detection value of di/dt has exceeded the second threshold (Step S104). When the detection value of di/dt has not exceeded the second threshold (NO at Step S104), the procedure returns to Step S202. Meanwhile, when the detection value of di/dt has exceeded the second threshold (YES at Step S104), the procedure shifts to Step S105 where it is then determined that a load short circuit has occurred, and the processing is ended.

As described above, an overcurrent detection circuit and a power converter according to the third embodiment determine an arm short circuit and a load short circuit that can occur in a switching element by using two types of mask periods, and therefore can perform short-circuit protection that is specialized to the types of short circuits. Accordingly, there is an advantageous effect that it is possible to perform short-circuit protection with a reduced probability of false detection, in addition to the advantageous effects in the second embodiment.

Although the present specification does not specifically refer to the material for switching elements, a semiconductor switching element (hereinafter, "SiC element") using silicon carbide (SiC) that draws attention in recent years as the material. The SiC element can perform high-speed switching, and therefore can be suitably used in the present invention that detects an overcurrent that flows in a switching element by using the di/dt detection circuit 10.

Further, because of the characteristic of the SiC element that a bandgap is larger than that of an Si element, the SiC element is an example of semiconductors called "wide bandgap semiconductors". Other than the SiC element, for example, gallium nitride-based material and a semiconductor formed by using diamond also belong to wide bandgap semiconductors, and the characteristics thereof have many similarities to the characteristics of SiC. Therefore, a configuration using a wide bandgap semiconductor other than SiC also constitutes the scope of the present invention.

The configurations described in the above embodiments are only examples of the content of the present invention. The configurations can be combined with other well-known techniques, and part of each of the configurations can be omitted or modified without departing from the scope of the present invention.

REFERENCE SIGNS LIST 10 di/dt detection circuit, 12 mask circuit, 14 control circuit, 16 driving circuit, 50 overcurrent detection circuit, 100 power conversion main circuit, 101 to 106 semiconductor element module, 110 smoothing capacitor, 111, 121 IGBT, 112, 122 FWD.

The invention claimed is:
1. An overcurrent detection circuit that is provided to correspond to each of a plurality of switching elements that constitute a power conversion main circuit, and detects an overcurrent in a corresponding one of the switching elements, the overcurrent detection circuit comprising:
a detection circuit to detect a rate of time change of a current that flows in a main terminal of the switching element; and
a control circuit to detect whether the current that flows in the main terminal of the switching element is an overcurrent based on the rate of time change and to output a detection result to a driving circuit provided to correspond to the switching element, wherein when the rate of time has exceeded a first threshold the control circuit determines that an arm short circuit that is a first short circuit has occurred, and when the rate of time has exceeded a second threshold, being smaller than the first threshold, the control circuit determines that a load short circuit that is a second short circuit has occurred.

2. The overcurrent detection circuit according to claim 1, wherein the control circuit detects the overcurrent in one of the switching elements.

3. The overcurrent detection circuit according to claim 1, further comprising a mask circuit to set a mask period in which an operation of overcurrent determination in the control circuit is masked, wherein the control circuit ignores or holds a detection result of the detection circuit while the mask period is set.

4. The overcurrent detection circuit according to claim 3, wherein the mask circuit transmits a first mask period and a second mask period that is longer than the first mask period to the control circuit, and the control circuit performs determination of the first short circuit after the first mask period has passed after turning on a gate of the switching element, and performs determination of the second short circuit after the second mask period has passed after turning on a gate of the switching element.

5. A power converter comprising the overcurrent detection circuit according to claim 1.

6. The power converter according to claim 5, wherein a corresponding one of the switching elements is protected from an overcurrent.

7. The overcurrent detection circuit according to claim 2, further comprising a mask circuit to set a mask period in which an operation of overcurrent determination in the control circuit is masked, wherein the control circuit ignores or holds a detection result of the detection circuit while the mask period is set.

8. The overcurrent detection circuit according to claim 7, wherein the mask circuit transmits a first mask period and a second mask period that is longer than the first mask period to the control circuit, and the control circuit performs determination of the first short circuit after the first mask period has passed after turning on a gate of the switching element, and performs determination of the second short circuit after the second mask period has passed after turning on a gate of the switching element.

9. A power converter comprising the overcurrent detection circuit according to claim 2.

10. A power converter comprising the overcurrent detection circuit according to claim 3.

11. A power converter comprising the overcurrent detection circuit according to claim 7.

12. A power converter comprising the overcurrent detection circuit according to claim 4.

13. A power converter comprising the overcurrent detection circuit according to claim 8.

14. The power converter according to claim 9, wherein a corresponding one of the switching elements is protected from an overcurrent.

15. The power converter according to claim 10, wherein a corresponding one of the switching elements is protected from an overcurrent.

16. The power converter according to claim 11, wherein a corresponding one of the switching elements is protected from an overcurrent.

17. The power converter according to claim 12, wherein a corresponding one of the switching elements is protected from an overcurrent.

18. The power converter according to claim 13, wherein a corresponding one of the switching elements is protected from an overcurrent.

* * * * *